Figure 1:
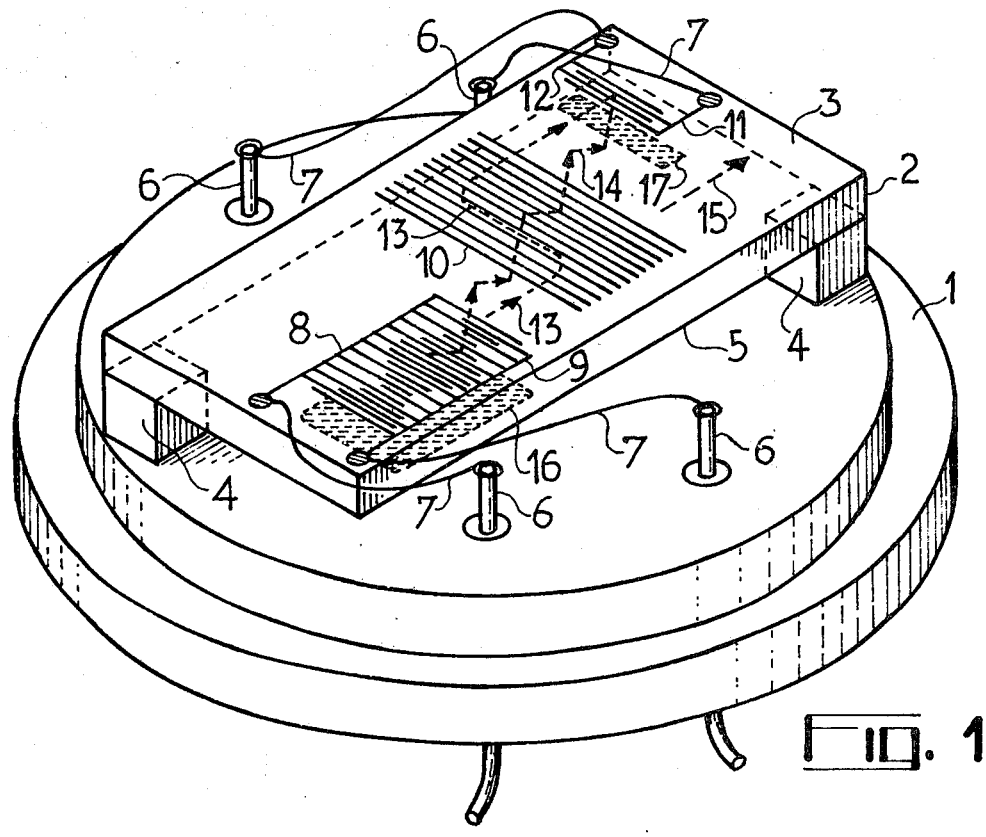

United States Patent [19]
Coussot

[11] 3,983,514
[45] Sept. 28, 1976

[54] SURFACE ACOUSTIC WAVE DEVICE AND METHOD OF MANUFACTURING SAME

[75] Inventor: Gérard Coussot, Paris, France

[73] Assignee: Thomson-CSF, Paris, France

[22] Filed: Feb. 14, 1975

[21] Appl. No.: 550,035

[30] Foreign Application Priority Data
Feb. 15, 1974  France .................. 74.05204

[52] U.S. Cl. .................. 333/30 R; 310/8.2; 310/9.8; 333/72
[51] Int. Cl.² .................. H03H 9/26; H03H 9/30; H03H 9/32; H01L 41/10
[58] Field of Search .................. 333/71, 72, 30 R; 310/8, 8.1, 8.2, 9.7

[56] References Cited
UNITED STATES PATENTS

| | | |
|---|---|---|
| 3,633,132 | 1/1972 | Hartemann .................. 333/30 R |
| 3,753,166 | 8/1973 | Worley et al. .................. 333/72 |
| 3,781,721 | 12/1973 | Judd et al. .................. 333/30 R |
| 3,836,876 | 9/1974 | Marshall et al. .................. 333/30 R |
| 3,887,887 | 6/1975 | Wagers et al. .................. 333/30 R |

*Primary Examiner*—Alfred E. Smith
*Assistant Examiner*—Marvin Nussbaum
*Attorney, Agent, or Firm*—Cushman, Darby & Cushman

[57] ABSTRACT

The present invention relates to electromechanical devices for the transmission of surface acoustic waves between a launching transducer and a receiving transducer arranged upon the main face of a substrate. The transmission device in accordance with the invention comprises ground zones provided in order to scatter the vibrational energy of bulk waves propagating within the thickness of the substrate. The creation of the ground zones involves the use of a jet of sand directed on to the large faces of the substrate.

5 Claims, 3 Drawing Figures

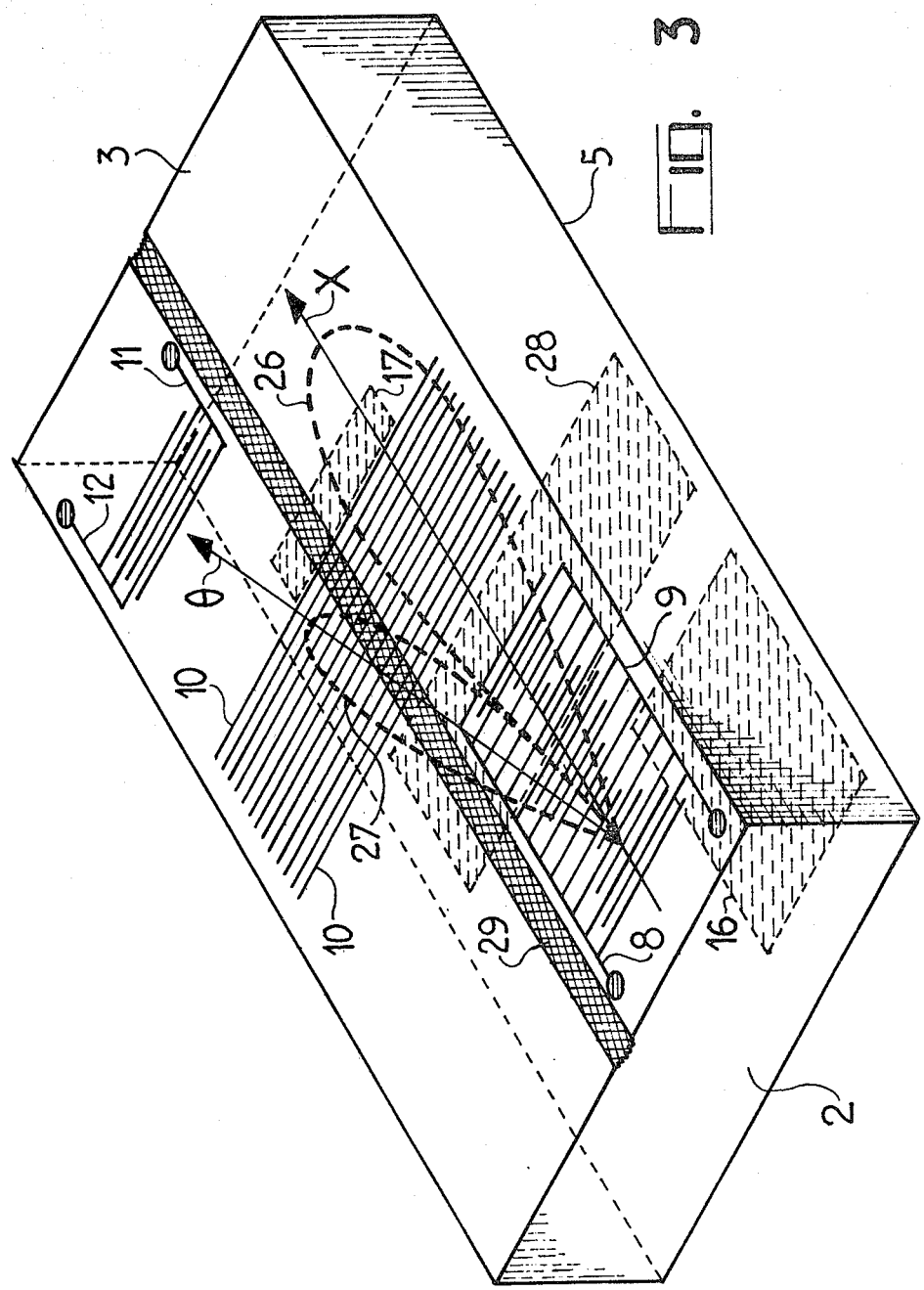

SURFACE ACOUSTIC WAVE DEVICE AND METHOD OF MANUFACTURING SAME

The present invention relates to acoustic delay lines and to electromechanical filters constituted by a substrate or wafer the top face of which is equipped with electromechanical transducer elements designed to emit and receive surface acoustic waves such as Rayleigh waves.

In a particular embodiment, these surface acoustic wave devices comprise two sets of comb shaped, interdigitated electrodes, arranged at the surface of a piezoelectric wafer. If an alternating voltage is applied to one of the two sets of electrodes, a vibrational radiation is emitted; in picking up this radiation, the other set of electrodes develops a voltage whose complex amplitude depends upon the chosen vibrational mode and the configuration of the electrodes.

Those skilled in the art will be aware that the mechanical vibrations can propagate through a solid body in the form of surface waves and bulk waves. It is essential, therefore, when employing surface wave propagation, to avoid the occurrence of parasitic signals generated by the presence of bulk waves. In particular, the transfer function of a surface acoustic wave filter may deviate from a specified model characteristic, because of an unwanted exchange of energy between the transducers due to the unwanted excitation of bulk waves. Similar operating anomalies are observed in surface acoustic wave delay lines because the parasitic bulk waves have transmission modes which do not correspond with the precisely defined modes of the surface acoustic waves.

The present invention puts forward means which make it possible to prevent the transmission of bulk waves in a surface acoustic wave device.

In accordance with the present invention, there is provided a surface acoustic wave device comprising a piezo electric wafer having two main faces opposite one another, and two sets of interdigitated comb shaped electrodes lying on one said main faces; said sets respectively forming a launching and a receiving transducer; said device further comprising on said one main face surface acoustic wave coupling means positioned between said transducers for causing the surface acoustic waves to follow within said one main face a path including a step; the other of said main faces comprising at least one ground zone facing at least one of said sets for scattering the bulk acoustic wave travelling across the thickness of said piezo electric wafer.

The invention likewise relates to a method of manufacturing a surface acoustic wave device comprising a wafer equipped with electromechanical transducers on one of its main faces. The method consists in creating upon the other main face of the wafer and opposite at least one of said transducers, at least one ground zone having a scattering effect upon the bulk waves. The ground zone is produced by directing on to the other main face of the wafer, a jet of abrasive particles and by displacing the point of impact of said jet throughout said ground zone.

Figure 2:
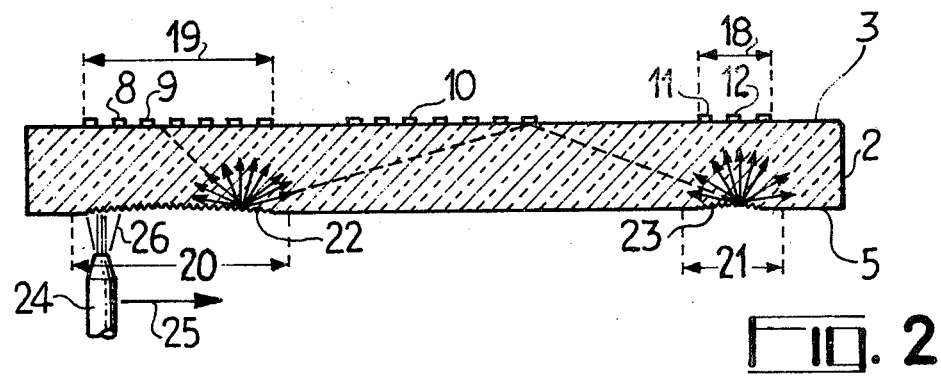

For a better understanding of the present invention and to show how the same may be carried into effect, reference will be made to the ensuing description and the attached figures, among which:

FIG. 1 illustrates an isometric view of a surface acoustic wave device in accordance with the invention;

FIG. 2 an explanatory diagram;

FIG. 3 illustrates a variant embodiment of the device shown in FIG. 1.

In FIG. 1, there can be seen by way of non-limitative example, a surface acoustic wave electromechanical filter designed to filter in accordance with a specified model characteristic, signals of intermediate frequency transmitted through the video amplifier channel of a television receiver. In order to clarify the drawing, the protective casing of the filter has been removed from the base 1. The filter proper is constituted by a piezo electric wafer 2 which rests upon the base 1 through the medium of spacers 4 or can be fixed there by some suitable other means. The top main face 3 of the wafer 2 carries a surface acoustic launching transducer array, made up of a first set of interdigitated comb shaped electrodes, 9 and 8. The comb shaped structures 9 and 8 are electrically connected to the insulated leadthrough 6 in the base 1, by lead wires 7. The main face 3 likewise carries a receiving transducer array made upon of a second set of interdigitated comb shaped electrodes, 11 and 12, connected by the leads 7 to two other insulated leadthroughs 6 in the base 1. Between the launching and receiving transducer arrays there are arranged surface acoustic wave coupling means constituted by an array of parallel conductive filaments 10 whose spacing is chosen as a function of the wavelength so that the surface acoustic waves follow the trajectory 13 along the two rectilinear portions thereof which are respectively perpendicular to the teeth of the combs 8, 9 and 11, 12. The intermediate part of the trajectory 13 constitutes a step in the energy path which does not represent an actual path of propagation of surface acoustic waves, but symbolises the complete transfer of energy between that half of the coupler 10 which receives the wave emitted by the launching transducer and the other half which re-emits the surface wave exciting the receiving transducer. The decoupling step represented by the trajectory 13 means that in the direction 17, the vibrational energy of the surface waves excited by the launching transducer, is substantially zero; by contrast, the vibrational energy of bulk waves stemming from the launching transducer is not affected by the presence of the coupler 10 and since it does not reach any receiving transducer, it does not affect the surface wave operation of the device.

However, undesirable coupling exists between the launching and receiving transducers as a consequence of bulk waves following the trajectory shown by the broken line 14. This transmission mode develops within the thickness of the wafer 2 and depends upon reflections which take place at the bottom main face 5 of the wafer.

In order to eliminate this unwanted coupling between the launching and receiving transducers, the invention provides for the face 5 of the wafer 2 to be ground prior to assembly on the base 1. This grinding is limited to zones 16 and 17 of the face 5 which are located opposite the electrode arrays 8, 9, 11 and 12 and is carried out by directing on to the face 5 a jet of abrasive particles having a grain size preferably close to the wave length of the unwanted vibrational radiation.

FIG. 2 is a section through the wafer 2 in a plane containing the direction of propagation of the surface acoustic waves. A dashed line within the thickness of the wafer 2, illustrates the path taken by the bulk waves produced by the launching transducer to which an alterning excitation voltage has been applied.

In order to ensure scattering of the bulk waves, the invention provides for a zone 22 on the face 5 of the wafer 2 to be ground by the use of a jet of abrasive particles 26 discharged by a nozzle 24 which can scan the range 20 of the ground zone 22, in the direction 25. Thanks to this grinding operation, the vibrational energy of the bulk waves is scattered in all directions and only a negligible fraction of this energy is capable of giving rise to a disturbing voltage between the teeth of the comb structures 11 and 12 of the receiving transducer. A similar grinding operation carried out in the zone 23 of range 21, located opposite the receiving transducer, further reduces the undesired influence of bulk waves. The ranges 20 and 21 of the ground zones 22 and 23, are at least equal to the respective ranges 19 and 18 of the emitter and receptor transducers. The ground zones 22 and 23 have a mean hollow profile in relation to the face 5 and are made up of the tiny projections resulting from the abrasive action of the jets 26.

In the case of a wafer made of lithium niobate, the grinding can be carried out by using a gas flow which entrains at high velocity particles of a sand having a dimension of the order of 50 microns. This kind of processing makes it possible to produce scattering ground zones in a device designed to transmit alternating signals of a frequency in the order of some few tens of megahertz, by surface acoustic wave effect. The parasitic signals due to bulk waves, experience a drop in level of the order of 15 to 18 decibels thanks to the creation of ground zones in that face of the substrate opposite to the one which is transmitting the surface waves. By arranging for the eroding effect of the jet to penetrate deeper, it is possible to produce ground zone having a mean concave profile, which inhibit the transmission of bulk waves through the thickness of the plate, even more effectively.

The procedure of grinding using a sand jet, is more advantageous than that of cutting slots in the substrate in order to inhibit the bulk waves. It requires less time to carry out and completely avoids any risk of fracture of the crystalline wafer.

The suppression of the parasitic signals resulting from unwanted coupling between launching and receiving transducers in a surface acoustic wave device, is particularly necessary where it is a filter having a specified model characteristic, which is involved. In other words, there is a close relationship between the filter transfer function and its pulse response. This relationship, which is given by the Fourier transform, makes it possible in other words to choose the spacing between and length of the comb teeth, which are appropriate to the filter characteristic, but parasitic signals must not interfere with this relationship and render the filter unuseable.

In addition to parasitic signals produced by bulk waves which can be exchanged by launching and receiving transducers, consideration also has to be given to other parasitic signals, in particular ones occurring in the neighbourhood of the coupler and ones which are due to secondary radiation lobes emitted by the transducer comb structures. In FIG. 3, a variant embodiment of the device in accordance with the invention can be seen. The wafer 2 is made up of the same elements as shown in FIG. 1 and in order to improve the degree of attenuation of parasitic signals, on the face 5 an additional ground zone 28 has been provided and on the face 3 a ground band 29 beneath which there are arranged the conductive filaments 10 of the coupler. The ground zone 28 is located opposite the coupler and prevents bulk waves passing through the thickness of the wafer 2, from reaching the coupler and giving rise there to parasitic surface waves which would not be scattered by the ground zones 16 and 17. The ground band 19 does not affect the transmission of bulk waves but by its scattering action inhibits the direct transmission of a surface wave between the emitter and receptor transducers. The band 29 is aligned in the direction X of the main radiation lobe 26 of the surface acoustic waves coming from the comb structures 8 and 9. The secondary lobe 27 may have a radiation direction which encourages direct transmission of a surface wave towards the comb structures 11 and 12. To prevent this unwanted transmission effect due to the secondary lobe 27, the invention provides for the formation of the ground band 29 by the action of a jet of abrasive particles upon the face 3, before the conductors 10 are deposited there. The band 19 acts as a scattering element vis-a-vis surface waves and only a negligible fraction of the vibrational energy thus scattered, is capable of inducing a parasitic voltage across the terminals of the comb structures 11 and 12.

I claim:

1. Surface acoustic wave device comprising a piezoelectric wafer having two main faces opposite one another and two sets of interdigitated comb shaped electrodes lying on one of said main faces, said sets respectively forming a launching and a receiving transducer, said device further comprising on said one main face surface acoustic wave coupling means positioned between said transducers for causing the surface acoustic waves to follow within said one main face a path including a step, the other of said main faces comprising at least one ground zone facing at least one of said sets for scattering the bulk acoustic waves travelling across the thickness of said piezo-electric wafer.

2. Device as claimed in claim 1, wherein said coupling means are constituted by an array of parallel conductive filaments deposited upon that main face of said wafer which carries said sets of electrodes, one portion of said array picking up the surface waves emitted by one of said sets of electrodes and another portion of said array radiating said surface waves in the direction towards the other of said sets of electrodes.

3. Device as claimed in claim 1, wherein the other main face of said wafer is equipped with a further ground zone located opposite said coupling means, for producing a scattering effect upon bulk waves passing through the thickness of said wafer.

4. Device as claimed in claim 1, wherein that main face of said wafer carrying said sets of electrodes, comprises a ground band separating said sets of electrodes from one another, said coupling means straddling said ground band for effecting transfer of the energy of said surface acoustic waves, from one side of said ground band to the other.

5. Device as claimed in claim 1, wherein at least one of said sets of electrodes is made up of interdigitated comb-shaped electrodes having teeth of dissimilar lengths.

* * * * *